United States Patent [19]

Winter et al.

[11] Patent Number: 4,950,543

[45] Date of Patent: Aug. 21, 1990

[54] PROCESS FOR MAKING A STRUCTURAL ELEMENT SUBJECTED TO THERMAL STRESS WITH A PROTECTIVE COATING

[75] Inventors: Jörg Winter, Niederzier; Hans-Günter Esser, Linnich-Ederen; Francois Waelbroeck; Peter Wienhold, both of Linnich, all of Fed. Rep. of Germany

[73] Assignee: Kernforschungsanlage Julich GmbH, Julich, Fed. Rep. of Germany

[21] Appl. No.: 292,649

[22] Filed: Dec. 29, 1988

Related U.S. Application Data

[63] Continuation of Ser. No. 94,122, Sep. 4, 1987, abandoned.

[30] Foreign Application Priority Data

Sep. 6, 1986 [DE] Fed. Rep. of Germany ....... 3630419

[51] Int. Cl.$^5$ .......................... B05D 3/06; B32B 9/00
[52] U.S. Cl. ........................................ 428/408; 427/39
[58] Field of Search ........................... 427/39; 148/63; 428/408

[56] References Cited

U.S. PATENT DOCUMENTS

| | | | |
|---|---|---|---|
| 3,922,179 | 11/1975 | Weekers | 148/6.3 |
| 4,382,100 | 5/1983 | Holland | 427/39 |
| 4,436,761 | 3/1984 | Hayashi et al. | 427/39 |
| 4,647,494 | 3/1987 | Meyerson et al. | 427/39 |
| 4,663,183 | 5/1987 | Ovshinsky et al. | 427/39 |

FOREIGN PATENT DOCUMENTS

| | | |
|---|---|---|
| 3128022 | 8/1972 | Fed. Rep. of Germany . |
| 3316693 | 2/1979 | Fed. Rep. of Germany . |
| 2736514 | 3/1982 | Fed. Rep. of Germany . |
| 3442208 | 7/1985 | Fed. Rep. of Germany . |
| 61-52363 | 3/1986 | Japan . |
| 146411 | 7/1986 | Japan . |
| 244068 | 10/1986 | Japan . |

*Primary Examiner*—Stanley Silverman
*Attorney, Agent, or Firm*—Herbert Dubno

[57] ABSTRACT

The process for making a structural element subjected to a high thermal stress and made of a material of high thermal conductivity such as molybdenum, tungsten, copper, aluminum or an alloy of these metals with a protective layer protecting the surface of the structural element comprises treating the surface of the structural element to remove surface impurities present and then coating the surface with an amorphous hydrogen containing carbon layer. For reduction, i.e. removal, of the surface impurities the structural element can advantageously be exposed to a hydrogen flow containing hydrogen atoms and/or ions at a temperature of from 100° C. to 600° C. at a pressure of from $10^{-2}$ to $10^2$ Pa. The hydrogen atoms and/or the hydrogen ions coming in contact with the surface of the structural element are formed by contact dissociation at at least one hot surface or by glow discharge or by electron cyclotron resonance and the volatile products are pumped away. The layer of amorphous carbon is formed by subsequently directing a hydrocarbon ion stream at the cleaned surface at pressures from $10^{-2}$ to $10^2$ Pa.

11 Claims, No Drawings

PROCESS FOR MAKING A STRUCTURAL ELEMENT SUBJECTED TO THERMAL STRESS WITH A PROTECTIVE COATING

This is a continuation of co-pending application Ser. No. 094,122, filed on Sept. 4, 1987, now abandoned.

CROSS REFERENCE TO RELATED APPLICATIONS

This application is related to the concurrently filed commonly owned copending application Ser. No. 07/094,121 filed 4 Sept. 1987, now abandoned. based upon German Application No. P 36 30 418.2 filed 6 September 1986.

FIELD OF THE INVENTION

Our present invention relates to a process for making a structural element which is intended to be exposed to high thermal stress and, more particularly, to a process for making a structural element subject to high temperatures and having a protective layer protecting its surface.

BACKGROUND OF THE INVENTION

A structural component subject to high thermal stresses is required for example in experimental situations in which it serves as a collector for a particle stream or electromagnetic radiation and which receives the energy of particle electron ion beam. Thus in fusion experiments components are used on which protons leaving the plasma impact. Experience has shown that particles of the structural component ablate and reach the plasma where they become detrimented impurities.

OBJECTS OF THE INVENTION

It is an object of our invention to provide a process for making a structural element with a protective coating whereby these drawbacks are avoided.

It is also an object of our invention to provide a process for making a structural element subject to a high thermal stress from electromagnetic radiation or a particle beam, such as a proton beam, with a protective coating which remains intact for at least a brief time interval, (e.g. a few hundred msec) at an incident power level of, say, 120 MW/m$^2$.

It is another object of our invention to provide a process for making a structural element which is subjected to a high thermal stress with a protective coating which prevents erosion of the structural element at least for a brief time.

DESCRIPTION OF THE INVENTION

These objects and others which will become more readily apparent hereinafter are attained in accordance with our invention in a process for making a structural element subject to a high thermal stress with a protective layer protecting the surface of the structural element.

According to our invention the surface of the structural element which is composed of a material of high thermal conductivity is treated to remove surface impurities present on the surface and then an amorphous hydrogen containing carbon layer is used to coat the surface.

Advantageously the material of the structural element can be molybdenum, tungsten, copper, aluminum or a metal alloy thereof such as CuBe or TiZrMo.

For reduction, that is for removal, of the surface impurities which will combine with atomic hydrogen or low energy hydrogen, e.g. oxygen, carbon, chlorine, fluorine and sulfur, appropriately according to the process known from German Patent document-printed application DE-AS No. 26 47 088 the structural element can be exposed to a hydrogen flow containing hydrogen atoms and/or ions at a temperature of from 100° C. to 600° C., advantageously 300° C., at a pressure of from $10^{-2}$ to $10^2$ Pa.

The hydrogen atoms and/or the hydrogen ions coming in contact with the surface of the structural element can be formed by contact dissociation at at least one hot surface or by glow discharge or by electron cyclotron resonance. The volatile compounds formed as products are pumped away.

It is also advantageous for removal of the surface impurities when the structural element is exposed to a hydrogen flow with 0.1 to 3 % by volume methane. The stream contains hydrogen ions and/or hydrogen atoms at a temperature from 10° C. up to a maximum of 100° C. under a pressure of $10^{-2}$ to $10^2$ Pa for reduction of the surface impurities. The hydrogen atoms and/or the hydrogen ions and also hydrocarbon ions which come into contact with the surface to be cleaned can be formed by contact dissociation at at least one hot surface or by glow discharge or by electron cyclotron resonance. The volatile compounds thus formed are pumped away. Oxygen as a surface impurity on the metal is preferentially transformed into the volatile and easily removed carbon monoxide.

To perform this process filaments or coils of tungsten, rhenium or tantalum can be used as the hot surface or surfaces.

A direction of the stream of hydrogen atoms and/or ions or also the hydrocarbon ions to the surfaces to be cleaned can be accomplished by an electric field or because a suitable geometry of the container in which the structural element is located during the cleaning is chosen so that atoms and/or ions reach the surface to be cleaned.

In regard to the transport of volatile compounds from the surface, care should be taken to provide a sufficient pump speed or power corresponding to the production rate of volatile compounds so that the arising compounds are pumped away.

It has proven particularly suitable when the current density of the atom and/or ion beam directed at the surface amounts to a few microamperes/cm$^2$ up to a few hundred microamperes/cm$^2$ and that this current density is maintained for at least a half hour.

To apply the amorphous hydrogen-containing carbon layer the surface of the structural element is exposed to a hydrocarbon ion beam at a pressure of $10^{-2}$ to $10^2$ Pa. The hydrocarbon ions are made in a glow discharge or by electron cyclotron resonance and are directed to the surface of the structural element to be coated.

The direction of the hydrocarbon ions can be accomplished by an electric field or also, since an ion energy of about 10 eV is sufficient on impingement on the wall, by suitable choice of geometry of the container in which the structural element is located for coating so that the ions reach the surface of the structural element.

The hydrocarbon supplied in the container can be pure methane, however it is also suitable to use a methane/hydrogen mixture which contains at least 3% methane by volume. The hydrogen of the hydrogen gas and/or the methane can be partially or entirely replaced by deuterium or tritium in the isotope ratios of the plasma used with the structural element in the fusion plant.

The surface of the structural element to be coated can be at room temperature during application of the carbon layer; however to make a stable carbon layer the surface during the application of the layer is maintained at a higher temperature (at a maximum of 600° C.).

SPECIFIC EXAMPLES

EXAMPLE 1

A molybdenum body with dimensions 2 cm×2 cm×1 cm was mounted in a vacuum vessel in which a glow discharge was maintained in a hydrogen flow at a working pressure of $10^{-1}$ Pa. The sample was connected to an electrical circuit as the cathode and could be maintained at a temperature of 300° C. by a separate electrical resistance heater.

The oxygen and carbon impurities on the surface of the sample were be converted to water and/or methane and/or carbon monoxide by the flow of hydrogen ions at a current density of 10 microamperes/cm and pumped away.

After a half hour a hydrogen-methane mixture (methane content 15% by volume) was introduced instead of hydrogen with, however, the other conditions being kept the same. An amorphous hydrogen-containing carbon layer then is deposited on the molybdenum surface to a thickness of 1000 Angström on its side facing the plasma after a reaction time of 5 hours.

The sample thus finished was exposed to a thermal stress of 120 MW/m$^2$ by an electron bombardment lasting several hundred milliseconds.

The carbon layer applied to the sample was free from damage by this thermal stress.

EXAMPLE 2

The cleaning of the sample and the application of the carbon layer was undertaken in the same way as in example 1. However instead of the molybdenum sample a sample of copper was used. In this case also the impervious carbon layer remained undamaged in the stress test performed in the same way as in Example 1.

We claim:

1. In a method for protecting a structural element, subject to a high thermal stress from at least brief exposure to electromagnetic radiation, with a layer covering the surface of said structural element, the improvement wherein said surface of said structural element which is made of a metallic material of high thermal conductivity and selected from the group which consists of molybdenum, tungsten, copper, aluminum and the alloys CuBe and TiZrMo is treated to remove surface impurities present on said surface and then an amorphous hydrogen-containing carbon layer is applied to coat the treated surface, and thereafter the treated structural element is subjected to said electromagnetic radiation.

2. The improvement defined in claim 1 wherein said structural element for reduction of said surface impurities is exposed to a hydrogen flow containing hydrogen atoms and/or ions at a temperature of from 100° C. to 600° C. at a pressure of from $10^{-2}$ to $10^2$ Pa, said hydrogen atoms and/or said hydrogen ions coming in contact with said surface of said structural element and being formed by contact dissociation at at least one hot surface or by glow discharge or by electron cyclotron resonance, volatile compounds formed in reduction of said surface impurities being pumped away.

3. The improvement defined in claim 2 wherein said temperature is approximately 300° C.

4. The improvement defined in claim 2 wherein a current density of the atom or ion current directed at said surface of a few microamperes/cm$^2$ to a few hundred microamperes/cm$^2$ is maintained.

5. The improvement defined in claim 1 wherein said structural element is exposed to a hydrogen flow with 0.1 to 3% by volume methane containing hydrogen ions and/or hydrogen atoms and hydrocarbon ions at a temperature from 10° C. up to a maximum of 100° C. under a pressure of $10^{-2}$ to $10^2$ Pa for reduction of said surface impurities, said hydrogen atoms and/or said hydrogen ions and also hydrocarbon ions which are put in contact with said surface to be cleaned being formed by contact dissociation at at least one hot surface or by glow discharge or by electron cyclotron resonance, the volatile compounds thus formed being pumped away.

6. The improvement defined in claim 5 wherein the current density of the atom or ion current directed at said surface is a few microamperes/cm$^2$ to a few hundred microamperes/cm$^2$.

7. The improvement defined in claim 1 wherein said surface of said structural element is exposed to a hydrocarbon ion flow at a pressure of $10^{-2}$ to $10^2$ Pa for application of said amorphous hydrogen-containing carbon layer, said hydrocarbon ions being made in a glow discharge or by electron cyclotron resonance and being directed at said surface of said structural element to be coated.

8. The improvement defined in claim 7 wherein the thickness of said carbon layer is as much as 0.1 mm.

9. A method for protecting a structural element, subject to a high thermal stress from at least brief exposure to electromagnetic radiation, made of a metallic material of high thermal conductivity selected from the group which consists of molybdenum, tungsten, copper, aluminum and alloys thereof, said method comprising:
(i) applying a protective layer protecting the surface of said structural element comprising:
(a) treating said surface of said structural element for removal of surface impurities; and
(b) then exposing said surface of said structural element to a hydrocarbon ion flow at a pressure of $10^{-2}$ to $10^2$ Pa for application of an amorphous hydrogen-containing carbon layer, said hydrocarbon ions being made in a glow discharge or by electron cyclotron resonance and being directed at said surface of said structural element to be coated; and
(ii) exposing the treated structural element to electromagnetic radiation.

10. A method defined in claim 9 wherein said treating said surface for removal of said surface impurities before applying said carbon layer comprises exposing said surface to a hydrogen flow containing hydrogen atoms and/or ions at a temperature of from 100° C. to 600° C. at a pressure of from $10^{-2}$ to $10^2$ Pa; said hydrogen atoms and/or said hydrogen ions coming in contact with said surface of said structural element being formed by contact dissociation at at least one hot surface or by glow discharge or by electron cyclotron resonance, volatile compounds formed by removal of surface impurities being pumped away.

11. A structural element as made by the process used in the method of claim 9.

* * * * *